United States Patent
Kim et al.

(10) Patent No.: US 8,400,248 B2
(45) Date of Patent: Mar. 19, 2013

(54) WIRELESS POWER TRANSFER DEVICE

(75) Inventors: Yong Hae Kim, Daejeon (KR); Seung Youl Kang, Daejeon (KR); Sang Hoon Cheon, Daejeon (KR); Myung Lae Lee, Daejeon (KR); Je Hoon Yun, Daejeon (KR); In Kui Cho, Daejeon (KR); Jung Ick Moon, Daejeon (KR); Seong-Min Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/270,252

(22) Filed: Oct. 11, 2011

(65) Prior Publication Data

US 2012/0098349 A1   Apr. 26, 2012

(30) Foreign Application Priority Data

Oct. 20, 2010 (KR) ........................ 10-2010-0102192

(51) Int. Cl.
*H01F 5/00* (2006.01)
*H01F 27/30* (2006.01)
(52) U.S. Cl. .................. 336/200; 336/207; 336/208
(58) Field of Classification Search .................. 336/199, 336/200, 205, 207, 208, 232; 257/531
See application file for complete search history.

(56) References Cited

U.S. PATENT DOCUMENTS

| | | | | |
|---|---|---|---|---|
| 628,273 A * | 7/1899 | Morikawa | ................... | 235/59 A |
| 3,833,872 A * | 9/1974 | Marcus et al. | ................... | 336/83 |
| 4,937,729 A * | 6/1990 | Gadreau et al. | ............... | 363/134 |
| 6,054,914 A * | 4/2000 | Abel et al. | ..................... | 336/200 |
| 6,198,374 B1 * | 3/2001 | Abel | ............................. | 336/200 |
| 6,388,551 B2 * | 5/2002 | Morikawa | ..................... | 336/223 |
| 6,776,050 B2 | 8/2004 | Auch et al. | | |
| 6,958,608 B2 * | 10/2005 | Takagi et al. | ................. | 324/318 |
| 7,173,424 B2 * | 2/2007 | Saitoh et al. | .................. | 324/318 |
| 7,852,186 B2 * | 12/2010 | Fouquet et al. | ............... | 336/200 |
| 7,907,044 B2 * | 3/2011 | Tada et al. | ..................... | 336/200 |
| 7,994,889 B2 * | 8/2011 | Okabe et al. | .................. | 336/200 |
| 8,004,381 B2 * | 8/2011 | Katayama et al. | ............ | 336/200 |

FOREIGN PATENT DOCUMENTS

JP    2010-073976 A    4/2010
KR   10-2008-0005020 A   1/2008

OTHER PUBLICATIONS

André Kurs et al., "Wireless Power Transfer via Strongly Coupled Magnetic Resonances", Science, vol. 317, pp. 83-86 (Jul. 6, 2007).

* cited by examiner

*Primary Examiner* — Mohamad Musleh
*Assistant Examiner* — Joselito Baisa
(74) *Attorney, Agent, or Firm* — Rabin & Berdo, P.C.

(57) ABSTRACT

Provided is a wireless power transfer device. The wireless power transfer device includes: a base substrate including a base coil; transmission substrates spaced from the base substrate and including transmission coils; and a contact plug penetrating the base substrate and the transmission substrates to connect one ends of the transmission coils; wherein the transmission coils have the greater turn number than the base coil and transmitting/receiving a power signal through a magnetic resonance method.

5 Claims, 14 Drawing Sheets

WIRELESS POWER TRANSFER DEVICE

CROSS-REFERENCE TO RELATED APPLICATIONS

This U.S. non-provisional patent application claims priority under 35 U.S.C. §119 of Korean Patent Application No. 10-2010-0102192, filed on Oct. 20, 2010, the entire contents of which are hereby incorporated by reference.

BACKGROUND OF THE INVENTION

The present invention disclosed herein relates to a wireless power transfer device.

Recently, the performances and number of electronic products have been remarkably increased. Especially, portable electronic devices have been miniaturized due to rapid growth of semiconductor and display technologies. However, one of the drawbacks of electronic devices is that power should be supplied through a wire. A charger is used for charging electronic devices but after a predetermined time use, power needs to be supplied again to the electronic devices through a wire. In order to resolve the above drawback, technologies for wirelessly charging electronic devices have been developed. There are several cases using radio frequency or magnetic-induction.

If power is supplied wirelessly, since there is no possibility of a short circuit caused by water, safety is improved and the appearance of electric products becomes better because a cumbersome wire is unnecessary. However, since the magnetic-induction has an extremely short operating range, there are several inconveniences. To resolve this, a resonant wireless power transfer technology is introduced.

SUMMARY OF THE INVENTION

The present invention provides a highly reliable wireless power transfer device.

The present invention also provides a miniaturized wireless power transfer device.

Embodiments of the present invention provide wireless power transfer devices including: a base substrate including a base coil; transmission substrates spaced from the base substrate and including transmission coils; and a contact plug penetrating the base substrate and the transmission substrates to connect one ends of the transmission coils; wherein the transmission coils have the greater turn number than the base coil and transmitting/receiving a power signal through a magnetic resonance method.

In some embodiments, the contact plug may include first and second contact plugs; the transmission substrates may include first to third transmission substrates including first to third transmission coils, respectively, the second transmission substrate being disposed between the first and third transmission substrates; and the first contact plug may connect one ends of the respectively adjacent first and second transmission coils and the second contact plug may connect the other ends of the respectively adjacent second and third transmission coils.

In other embodiments, the first contact plug may be insulated from the third transmission coil and the second contact plug may be insulated from the first transmission coil.

In still other embodiments, the wireless power transfer devices may further include: a first material layer between the base substrate and the first transmission substrate; a second material layer between the first transmission substrate and the second transmission substrate; and a third material layer between the second transmission substrate and the third transmission substrate, wherein the first and second contact plugs further penetrate the first to third material layers.

In even other embodiments, the turn numbers of the transmission coils may be the same each other.

In yet other embodiments, the wireless power transfer device of may further include a connector connected to one end and the other end of the base coil.

In further embodiments, the contact plug may include the same material as the base coil and the transmission coils.

In still further embodiments, the contact plug may be insulated from the base coil.

In even further embodiments, the wireless power transfer devices may further include: first and second conductive plugs penetrating the base substrate and the transmission substrates; a connector connected to one end of the base coil; and a first connection wiring connecting the first conductive plug with the connector; wherein the second conductive plug is connected to the other end of the base coil.

In yet further embodiments, the first and second conductive plugs may be insulated from the transmission coils.

In yet further embodiments, at least one of the transmission substrates may include a second connection wiring connecting the first and second conductive plugs.

In yet further embodiments, the conductive plugs may include the same material as the contact plug.

In other embodiments of the present invention, wireless power transfer devices include: a first coil disposed in a first plane; a second coil disposed in a second plane spaced vertically from the first plane and having the greater turn number than the first coil; a third coil disposed in a third plane spaced vertically from the first and second planes and having the greater turn number than the first coil; and a contact plug connecting respectively adjacent one ends of the second coil and the third coil, wherein the first coil is one of a power coil and a load coil and the second and third coils transmit/receive a power signal through a magnetic resonance method.

In some embodiments, the contact plug may extend in a direction vertical to the first plane.

In other embodiments, the lengths of the second and third coils may be the same.

In still other embodiments, the second and third coils may overlap each other.

In even other embodiments, a direction that one end of the second coil progresses into the other end of the second coil may be opposite to a direction that one end of the third coil progresses into the other end of the third coil.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 3A through 3D are views illustrating first, second, and third transmission substrates in the wireless power transfer device according to the first embodiment of the present invention;

DETAILED DESCRIPTION OF PREFERRED EMBODIMENTS

Figure 1:
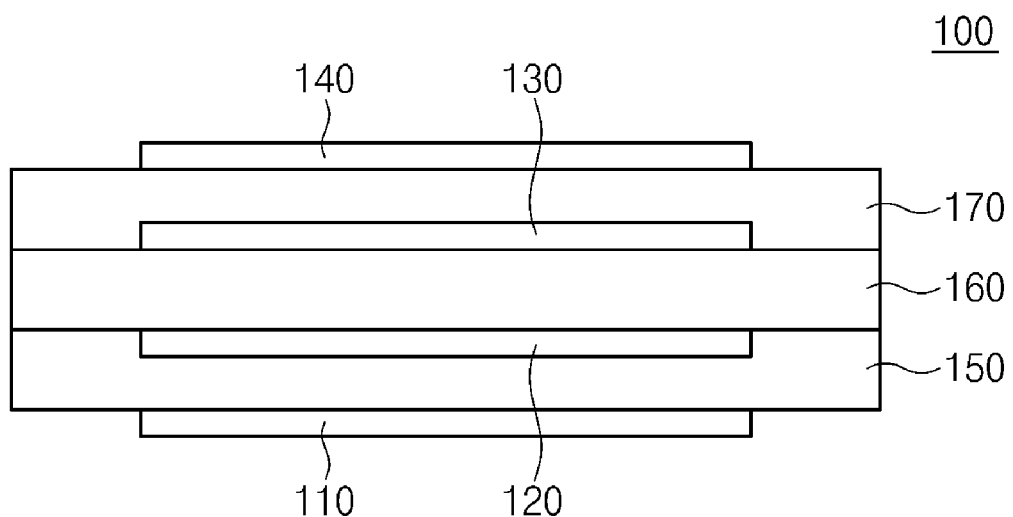
FIG. 1 is a view illustrating a wireless power transfer device according to a first embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Therefore, a layer referred to as a first layer in one embodiment can be referred to as a second layer in another embodiment. Like reference numerals refer to like elements throughout. An embodiment described and exemplified herein includes a complementary embodiment thereof.

A wireless power transfer device according to a first embodiment will be described.

FIG. 1 is a view illustrating a wireless power transfer device according to a first embodiment of the present invention.

Referring to FIG. 1, the wireless power transfer device 100 according to the first embodiment of the present invention may include a base substrate 110 and transmission substrates 120, 130 and 140, which are spaced from each other and stacked.

A first material layer 150 is disposed between the base substrate 110 and the first transmission substrate 120; a second material layer 160 is disposed between the first transmission substrate 102 and the second transmission substrate 130; and a third material layer 170 is disposed between the second transmission substrate 130 and the third transmission substrate 140. Thereby, the base substrate 100 and the transmission substrates 120, 130, and 140 may be vertically spaced from each other. The first material layer 150 and the third material layer 170 may include the same material. For example, the first and third material layers 150 and 170 may include prepreg. The second material layer 160 may be copper clad laminated (CCL). The first and third material layers 150 and 170 may have a thickness of about 0.36 mm and the second material layer 160 may have a thickness of about 0.4 mm.

Each of the base substrate 110 and the transmission substrates 120, 130, and 140 may include a coil, and the coils of the transmission substrates 120, 130, and 140 may be connected to each other through contact plugs. This will be described with reference to FIGS. 2, 3A through 3D.

Figure 2:
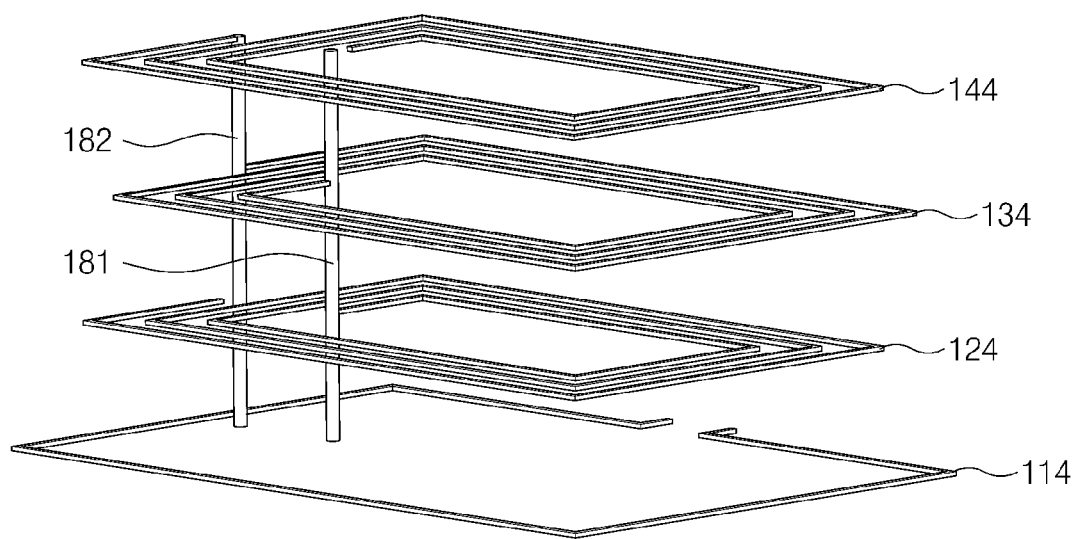
FIG. 2 is a view illustrating a base coil, transmission coils, and a contact plug in the wireless power transfer device according to the first embodiment of the present invention.
Figure 3A:
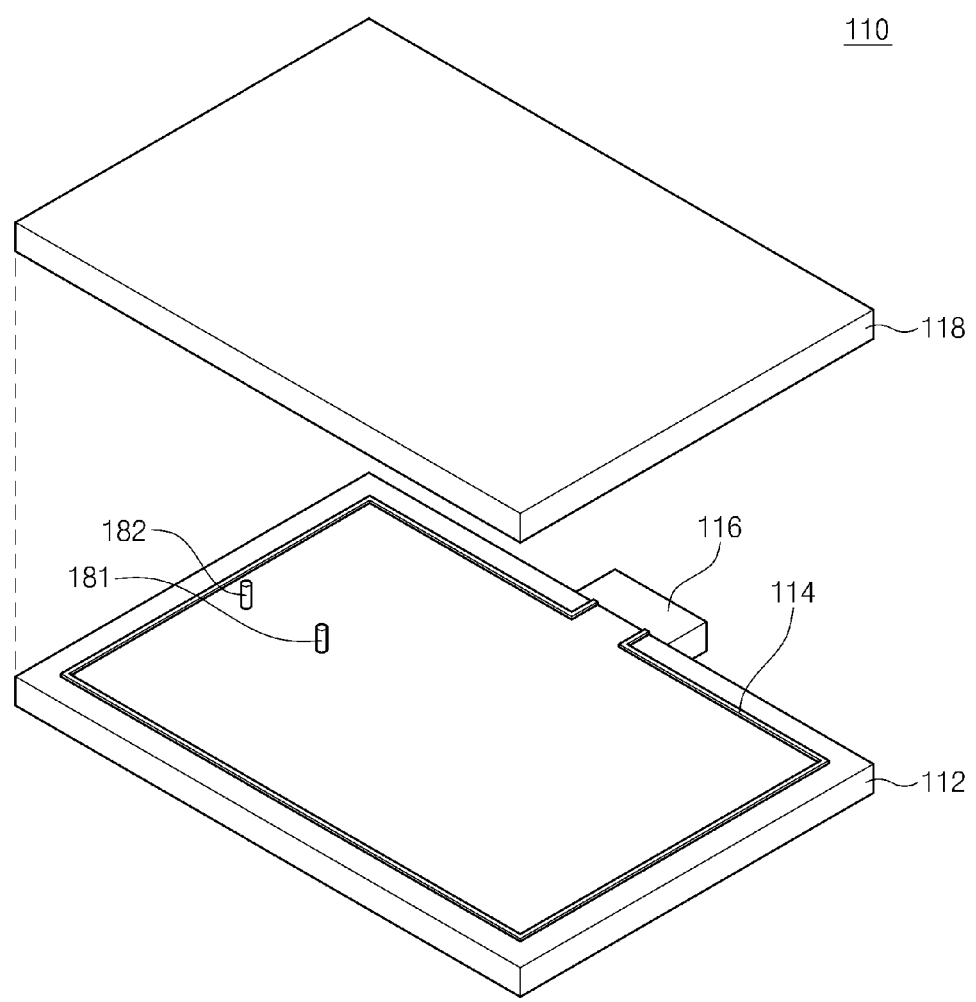
FIG. 3A is a view illustrating a base substrate in the wireless power transfer device according to the first embodiment of the present invention.
Figure 3B:
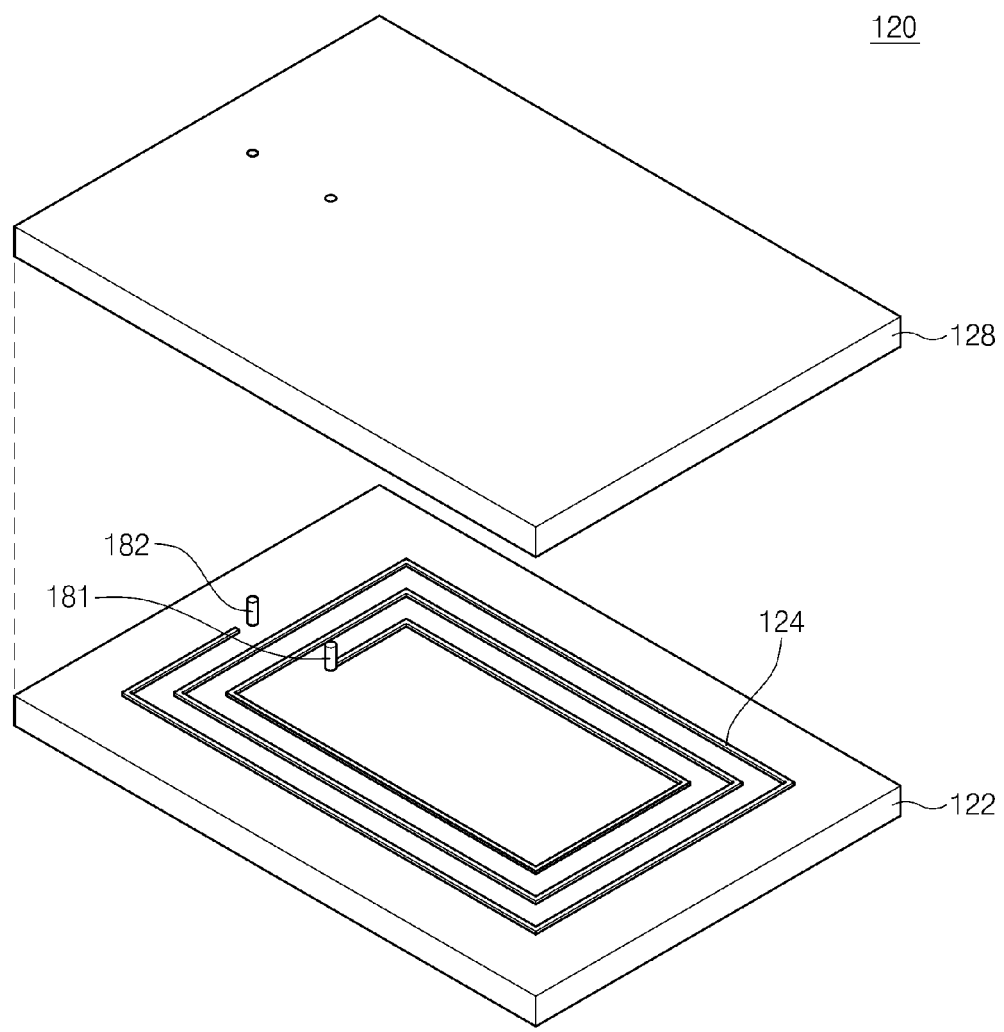
Figure 3C:
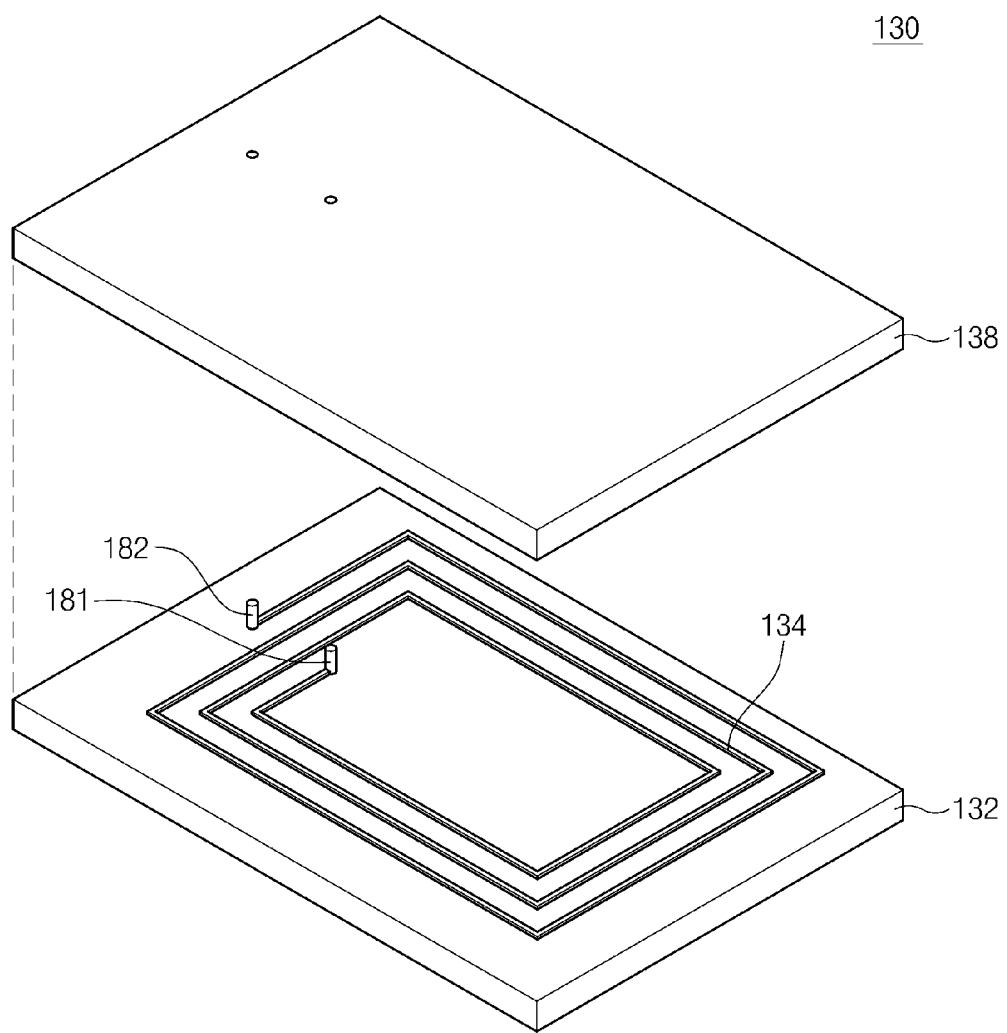
Figure 3D:
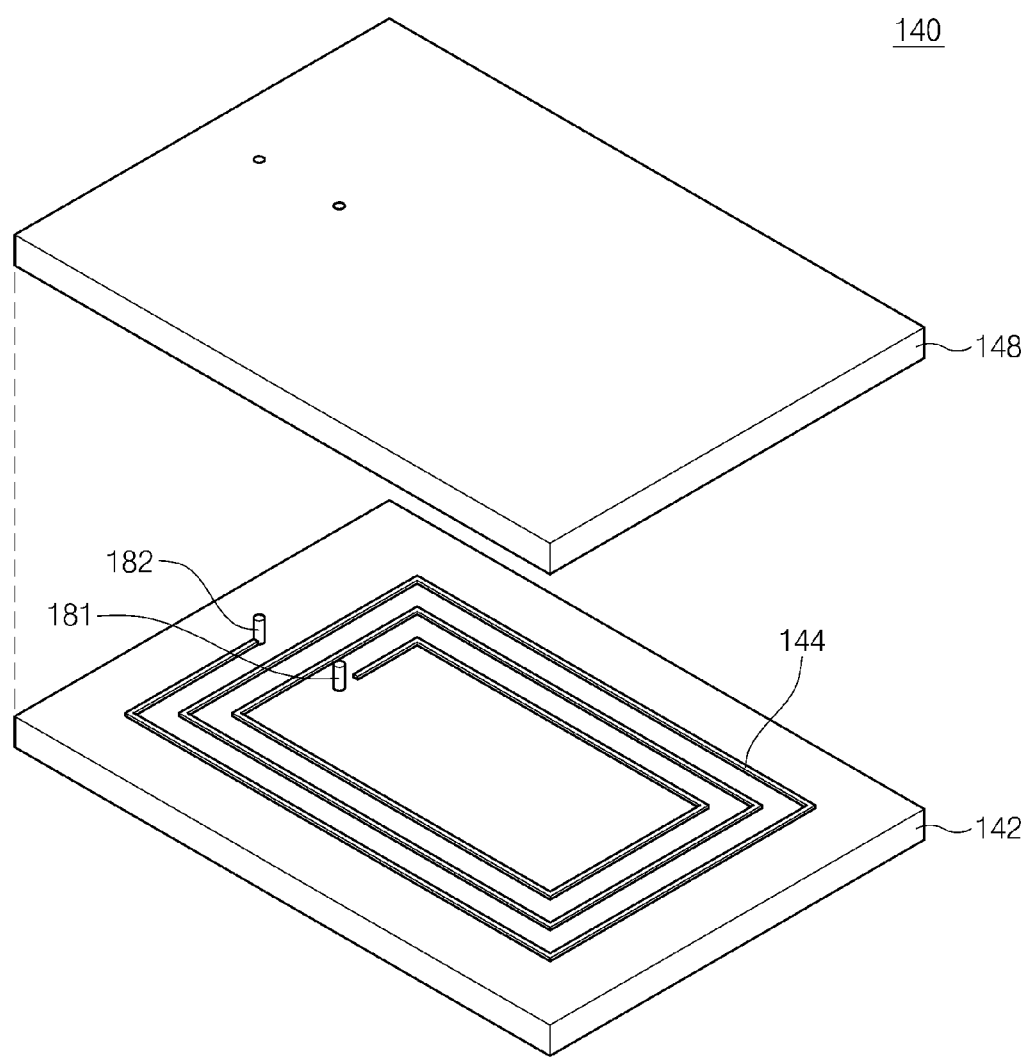

FIG. 2 is a view illustrating a base coil, transmission coils, and a contact plug in the wireless power transfer device according to the first embodiment of the present invention and FIGS. 3A through 3D are views illustrating a base substrate, and first, second, and third transmission substrates in the wireless power transfer device according to the first embodiment of the present invention.

Contact plugs 181 and 182 penetrating the base substrate 110 and the transmission substrates 120, 130, and 140 are provided. The contact plugs 181 and 182 may further penetrate the first to third material layers 150, 160, and 170. The contact plugs 181 and 182 may vertically penetrate the base substrate 110 and the transmission substrates 120, 130, and 140. The contact plugs 181 and 182 may be obtained by forming holes (that penetrate the stacked base substrate 110, transmission substrates 120, 130, and 140, and material layers 150, 160, and 170) and filling the holes with a conductive material.

The base substrate 110 may include a lower substrate 112, a base coil 114 on the lower substrate 112, a connector 116, and an insulation layer 118 covering the lower substrate 112. The lower substrate 112 may be a printed circuit board (PCB). The base coil 114 may be one of a power coil or a load coil. The base coil 114 may be obtained by forming a copper layer on the lower substrate 112 and patterning the copper layer. Thereby, the base coil 114 may be disposed on the top surface of the lower substrate 112. Unlike those shown in FIG. 3A, the turn number of the base coil 114 may be more than 2. The width of the base coil 114 may be about 0.15 mm and the height of the base coil 114 may be about 0.035 μm.

The base coil 114 may not contact the contact plugs 181 and 182. The base coil 114 may be insulated from the contact plugs 181 and 182. The base coil 114 may be formed to surround the contact plugs 181 and 182. Thereby, the contact plugs 181 and 182 may be disposed inside the base coil 114.

The base coil 114's both ends may be connected with the connector 116. The connector 116 may be used for connecting the wireless power transfer device 100 with an external electronic device. The connector 116 may be a Sub Miniature type A (SMA) connector.

The transmission substrates 120, 130, and 140 may include lower substrates 122, 132, and 142, transmission coils 124, 134, and 144 on the lower substrates 122, 132, and 142, and insulation layers 128, 138, and 148 covering the lower substrates 122, 132, and 142. The lower substrates 122, 132, and 142 may be a PCB substrate. The transmission coils 124, 134, and 144 may be vertically spaced from the base coil 114. The turn numbers of the transmission coils 124, 134, and 144 may be greater than that of the base coil 114. The turn numbers of the transmission coils 124, 134, and 144 may be the same. Unlike those shown in FIGS. 3B through 3D, the turn numbers of the transmission coils 124, 134, and 144 may vary. The maximum diameters of the transmission coils 124, 134, and 144 may be less than that of the base coil 114. The maximum diameters of the transmission coils 124, 134, and 144 may be the same.

The transmission coils 124, 134, and 144 may be formed using the same material and method as the base coil 114. For example, the transmission coils 124, 134, and 144 may be obtained by forming a copper layer on the lower substrates 122, 132, and 142 and patterning the copper layer. Due to this, the transmission coils 124, 134, and 144 may be disposed within the top surfaces of the transmission lower substrates 122, 132, and 142. The transmission coils 124, 134, and 144 may be vertically spaced apart from each other. The widths of the transmission coils 124, 134, and 144 may be about 0.15 mm and the height of the base coil 114 may be about 0.035 μm. The interval between the transmission coils 124, 134, and 144 may be about 0.3 mm.

The transmission coils 124, 134, and 144 may transmit or receive a signal of an electromagnetic wave through a magnetic resonance method thereby transmitting/receiving power. For example, if the base coil 114 is a power coil, the transmission coils 124, 134, and 144 may receive a power from the base coil 114, and then the transmission coils 124, 134, and 144 may transmit the power to external. Unlike this if the base coil 114 is a load coil, the transmission coils 124, 134, and 144 may receive a power from external and then the transmission coils 124, 134, and 144 may transmit the power to the base coil 114.

One end of the first transmission coil 124 may be connected to the first contact plug 181 and the other end of the first transmission coil 124 may not be connected to the first and second contact plugs 181 and 182. For example, the other end of the first transmission coil 124 may insulated from the first and second contact plugs 181 and 182. The one end of the first transmission coil 124 may be disposed inside the first transmission coil 124 and the other end of the first transmission coil 124 may be disposed outside the first transmission coil 124. A direction that the one end of the first transmission coil 124 progresses into the other end of the first transmission coil 124 may be a first direction. The first direction may be a clockwise direction. Unlike those shown in FIG. 3B, a direction that the one end of the first transmission coil 124 progresses into the other end of the first transmission coil 124 may be a second direction. The second direction may be anticlockwise direction.

One end and the other end of the second transmission coil 134 may be connected to the first and second contact plugs 181 and 182, respectively. The one end of the second transmission coil 134 may be disposed inside the second transmission coil 134 and the other end of the second transmission coil 134 may be disposed outside the second transmission coil 134. A direction that the one end of the second transmission coil 134 progresses into the other end of the second transmission coil 134 may be opposite to a direction that the one end of the second transmission coil 124 progresses into the other end of the second transmission coil 124. For example, if a direction that the one end of the second transmission coil 124 progresses into the other end of the second transmission coil 124 is the first direction, a direction that the one end of the second transmission coil 134 progresses into the other end of the second transmission coil 134 may be the second direction.

One end of the third transmission coil 144 may not be connected to the first and second contact plugs 181 and 182. The one end of the third transmission coil 144 may be insulated from the first and second contact plugs 181 and 182. The other end of the third transmission coil 144 may be connected to the second contact plug 182. The other end of the third transmission coil 144 may not be connected to the first contact plug 181. The other end of the third transmission coil 144 may be insulated from the first contact plug 181. The one end of the third transmission coil 144 may be disposed inside the third transmission coil 144, and the other end of the third transmission coil 144 may be disposed outside the third transmission coil 144. A direction that the one end of the third transmission coil 144 progresses into the other end of the third transmission coil 144 may be identical to a direction that the one end of the first transmission coil 124 progresses into the other end of the first transmission coil 124.

The second contact plug 182 may electrically connects the other end of the third transmission coil 144 with the other end of the second transmission coil 134 below the other end of the third transmission coil 144. The first contact plug 181 may electrically connect the one end of the second transmission coil 134 with the one end of the first transmission coil 124 below the one end of the second transmission coil 134.

According to an embodiment of the present invention, the transmission coils 124, 134, and 144 may be formed on the stacked lower substrates 122, 132, and 142 such that the stacked multi-layered transmission coils 124, 134, and 144 may be provided. Due to this, an interlayer capacitance between the transmission coils 124, 134, and 144 is increased such that a resonant frequency used for wireless power transfer may be reduced. Additionally, the base substrate 110 including the base coil 114 and the transmission substrates 120, 130, and 140 including the transmission coils 124, 134, and 144 may be stacked simultaneously. Due to this, the base coil 114 and the transmission coils 124, 134, and 144 are integrated into one so that a miniaturized and simplified wireless power transfer device may be provided.

The turn number of the base coil 114 is 1 according to the first embodiment of the present invention. Unlike this, for impedance matching, the turn number of the base coil may be more than 2. This will be described with reference to FIGS. 4, 5A through 5D.

A wireless power transfer device according to a second embodiment of the present invention will be described.

Figure 4:
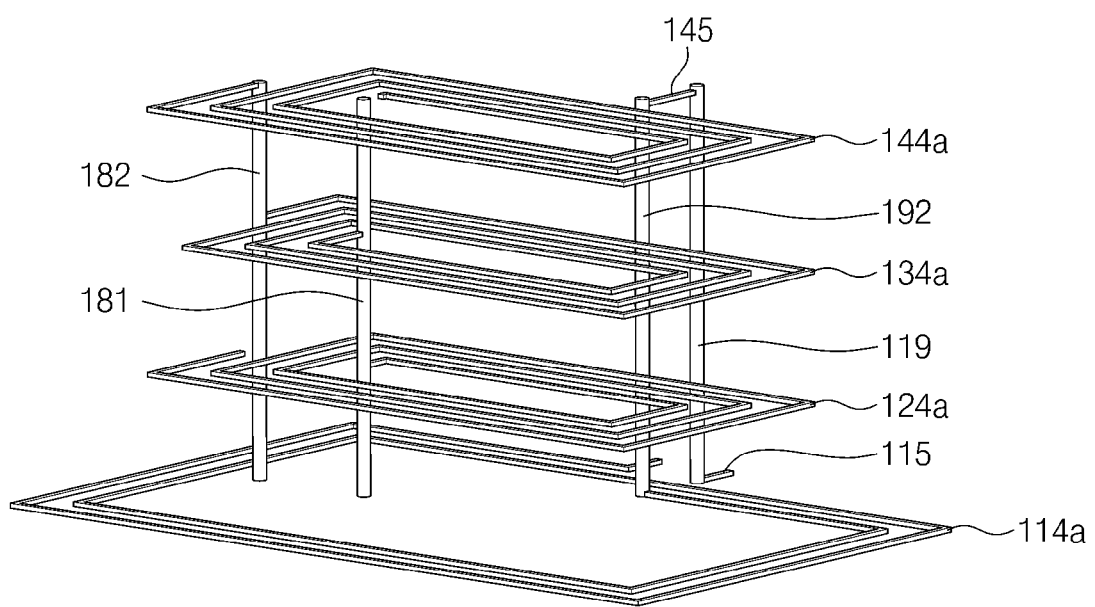
FIG. 4 is a view illustrating a base coil, transmission coils, and plugs in the wireless power transfer device according to the second embodiment of the present invention.
Figure 5A:
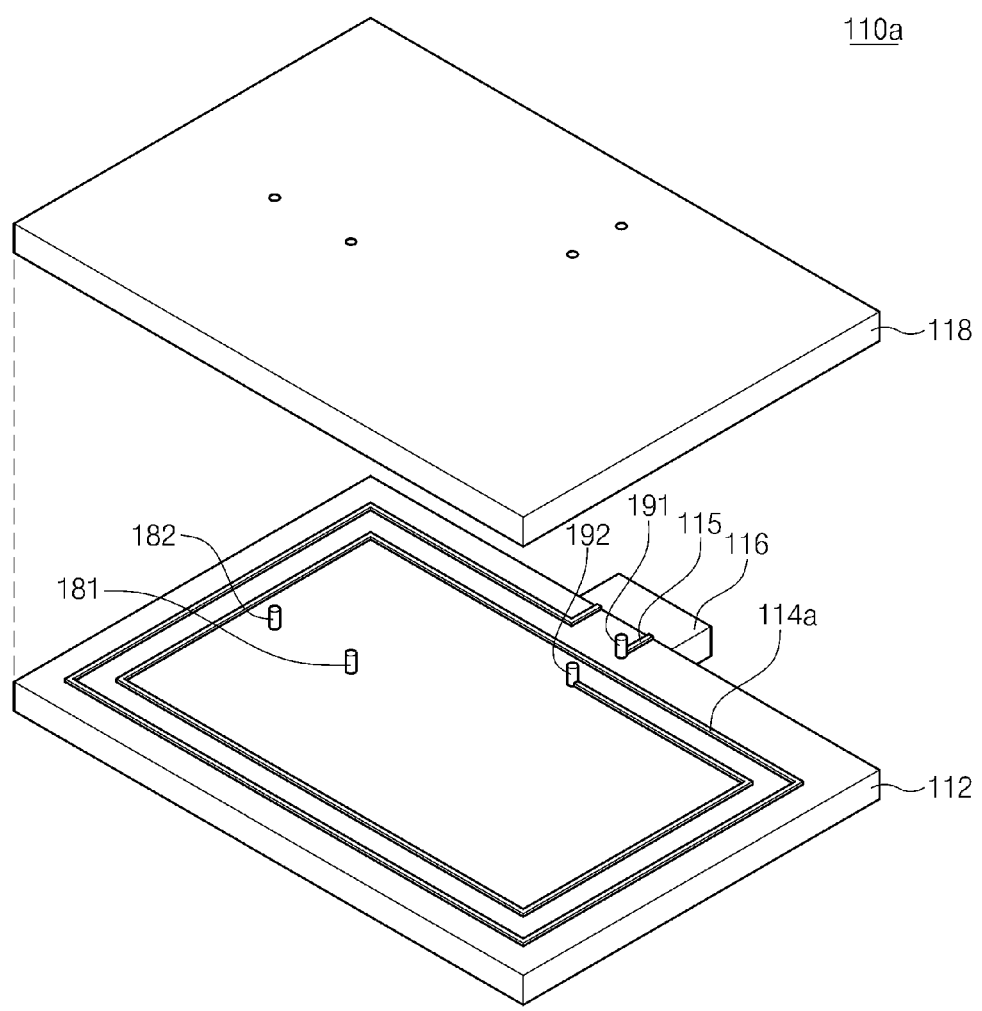
FIG. 5A is a view illustrating a base substrate in the wireless power transfer device according to the second embodiment of the present invention.
Figure 5B:
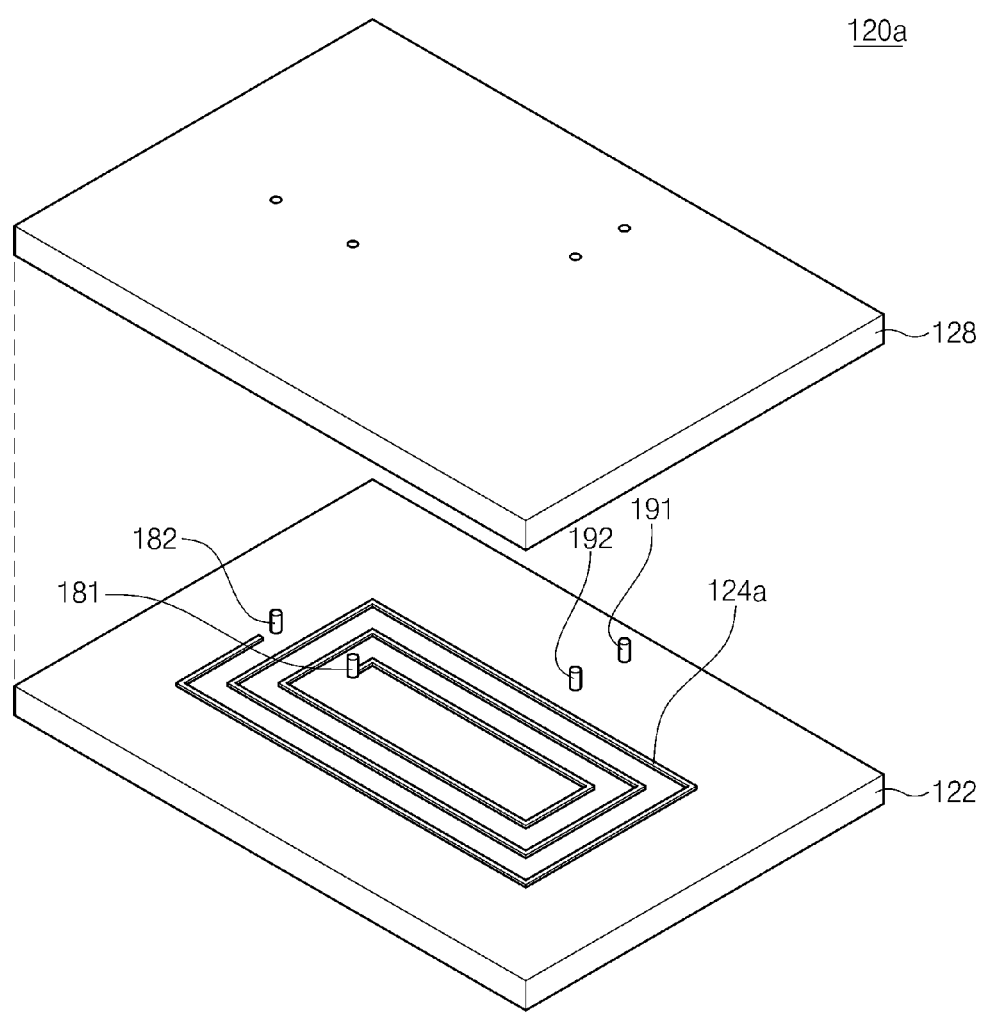
FIGS. 5B through 5D are views illustrating first to third transmission substrates in the wireless power transfer device according to the second embodiment of the present invention.
Figure 5C:
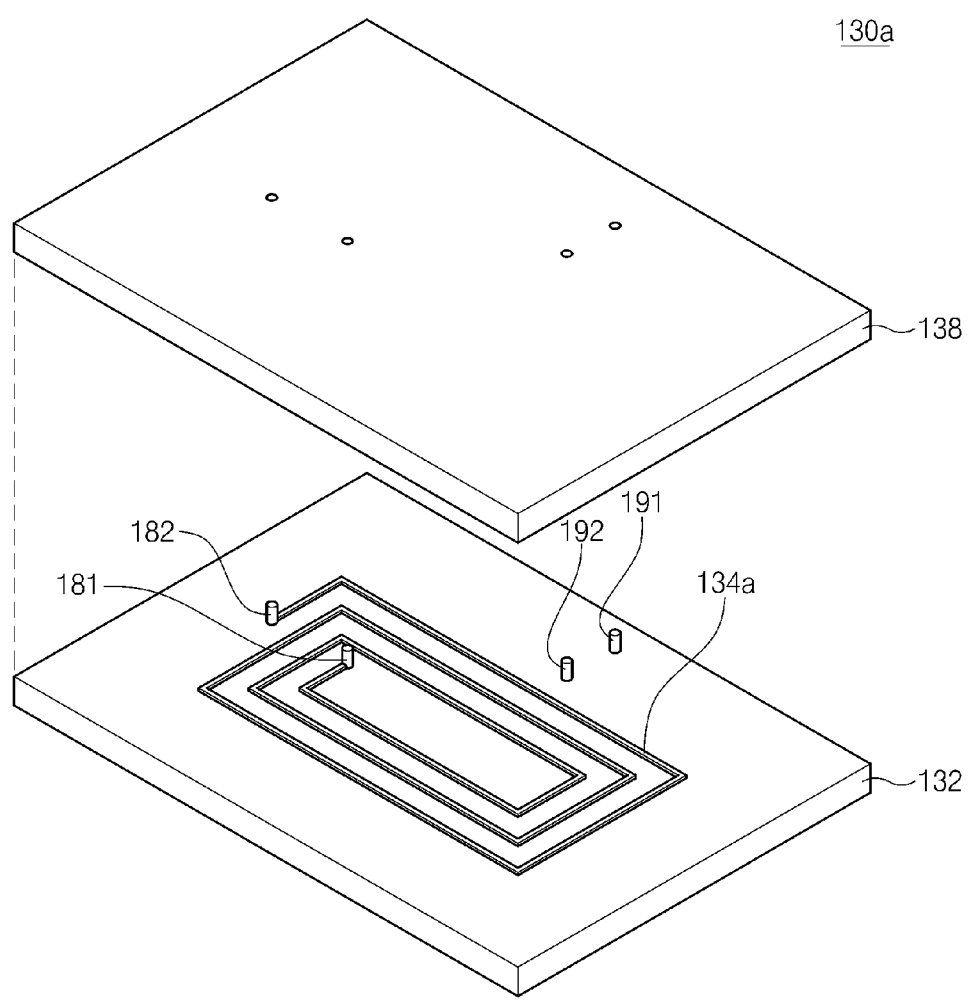
Figure 5D:
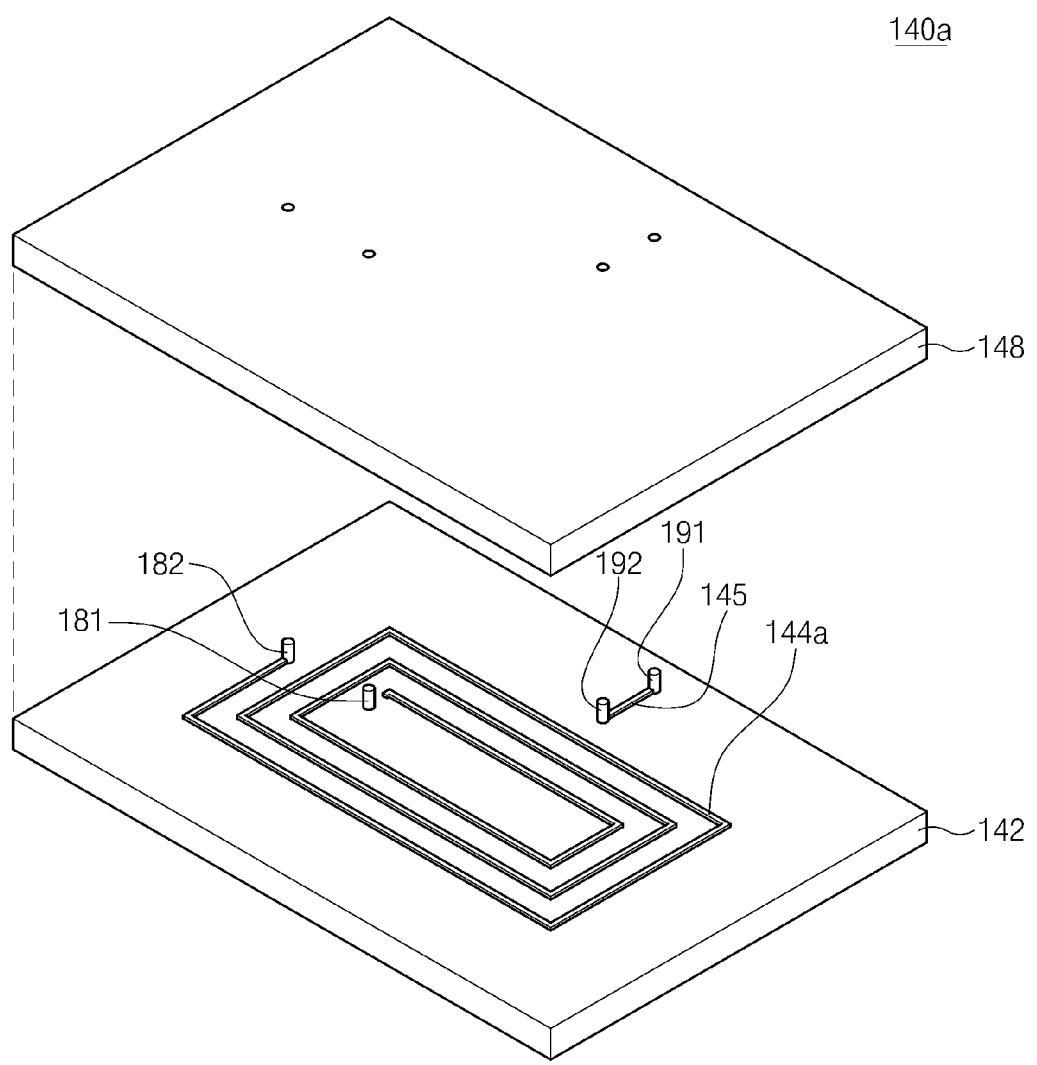

FIG. 4 is a view illustrating a base coil, transmission coils, and plugs in the wireless power transfer device according to the second embodiment of the present invention. FIGS. 5A through 5D are views illustrating a base substrate and first to third transmission substrates in the wireless power transfer device according to the second embodiment of the present invention.

Referring to FIGS. 4 and 5A through 5D, the wireless power transfer device of the second embodiment may include a base substrate 110*a* and transmission substrates 120*a*, 130*a*, and 140*a*. The first to third material layers 150, 160, and 170 described with reference to FIG. 1 may be interposed between the base substrate 110*a* and the transmission substrates 120*a*, 130*a*, and 140*a*.

Contact plugs 181 and 182 and conductive plugs 191 and 192, which penetrate the base substrate 110*a*, the transmission substrates 120*a*, 130*a*, and 140*a*, and the material layers 150, 160, and 170, may be provided. The plugs 181, 182, 191, and 192 may vertically penetrate the base substrate 110*a* and the transmission substrates 120*a*, 130*a*, and 140*a*. The contact plugs 181 and 182 and the conductive plugs 191 and 192 may be manufactured during the same process and thus may be formed of the same material. For example, the plugs 181, 182, 191, and 192 may be obtained by forming holes penetrating the stacked base substrate 110*a*, transmission substrates 120*a*, 130*a*, and 140*a*, and the material layers 150, 160, and 170 and filling the holes with a conductive material.

The base substrate 110*a* may include a lower substrate 112, a base coil 114*a* on the lower substrate 112, a connector 116, a first connection wiring 115, and an insulation layer 118 covering the lower substrate 112. The base coil 114*a* may be one of a power coil or a load coil. The turn number of the base coil 114*a* may be greater than 2.

One end of the base coil 114*a* may be connected to the connector 116. The other end of the base coil 114*a* may be connected to the second conductive plug 192. The one end of the base coil 114*a* may be disposed outside the base coil 114*a* and the other end of the base coil 114*a* may be disposed inside the base coil 114*a*.

The first connection wiring 115 may connect the connector 116 with the first conductive plug 191. The first connection wiring 115 may be formed using the same material and method as the base coil 114*a*.

The base coil 114*a* may not contact the contact plugs 181 and 182. The base coil 114*a* may be insulated from the contact plugs 181 and 182. The base coil 114*a* may be formed to surround the contact plugs 181 and 182. Due to this, the contact plugs 181 and 182 may be disposed inside the base coil 114*a*.

The transmission substrates 120*a*, 130*a*, and 140*a* may include lower substrates 122, 132, and 142, transmission coils 124*a*, 134*a*, and 144*a* on the lower substrates 122, 132, and 142, and insulation layers 128, 138, and 148 covering the lower substrates 122, 132, and 142. The transmission coils 124*a*, 134*a*, and 144*a* may transmit/receive a signal of an electromagnetic wave through a magnetic resonance method thereby transmitting/receiving power. The turn numbers of the transmission coils 124*a*, 134*a*, and 144*a* may be greater than that of the base coil 114*a*. The turn numbers of the transmission coils 124*a*, 134*a*, and 144*a* may be the same.

The base coil 114*a* and the transmission coils 124*a*, 134*a*, and 144*a* may be formed using the same material and method as those 114, 124, 134, and 144 of the wireless power transfer device according to the first embodiment of the present invention.

The transmission coils 124*a*, 134*a*, and 144*a* may not contact the first and second conductive plugs 191 and 192. The transmission coils 124*a*, 134*a*, and 144*a* may be insulated from the first and second conductive plugs 191 and 192.

At least one of the transmission substrates 120*a*, 130*a*, and 140*a* may include a second conductive wiring 145 connecting the first and second conductive plugs 191 and 192. For example, the second conductive wiring 145 may be formed on the lower substrate 142 of the third transmission substrate 140*a*. In this case, the second conductive wiring 145 may be formed using the same material and method as the third transmission coil 144*a*. The both ends of the base coil 114*a* may be connected to the connector 116, through the first and second conductive plugs 191 and 192 and the first and second conductive wiring 115 and 145.

One end of the first transmission coil 124*a* may be connected to the first contact plug 181 and the other end of the first transmission coil 124*a* may not be connected to the first and second contact plugs 181 and 182. The other end of the first transmission coil 124*a* may be insulated from the first and second contact plugs 181 and 182. The one end of the first transmission coil 124*a* may be disposed inside the first transmission coil 124 and the other end of the first transmission coil 124*a* may be disposed outside the first transmission coil 124. A direction that the one end of the first transmission coil 124 progresses into the other end of the first transmission coil 124 may be a first direction. The first direction may be a clockwise direction.

One end and the other end of the second transmission coil 134*a* may be connected to the first and second contact plugs 181 and 182, respectively. The one end of the second transmission coil 134*a* may be insulated from the second plug 182, and the other end of the second transmission coil 134*a* may be insulated from the first transmission coil 181. The one end of the second transmission coil 134*a* may be disposed inside the second transmission coil 134*a* and the other end of the second transmission coil 134*a* may be disposed outside the second transmission coil 134*a*. A direction that the one end of the second transmission coil 134*a* progresses into the other end of the second transmission coil 134*a* may be a second direction. The second direction may a counter clockwise direction.

One end of the third transmission coil 144*a* may not be connected to the first and second contact plugs 181 and 182. The one end of the third transmission coil 144*a* may be insulated from the first and second contact plugs 181 and 182. The other end of the third transmission coil 144*a* may be connected to the second contact plug 182. The other end of the third transmission coil 144*a* may be insulated from the first contact plug 181. The one end of the third transmission coil 144*a* may be disposed inside the third transmission coil 144*a*, and the other end of the third transmission coil 144*a* may be disposed outside the third transmission coil 144. A direction that the one end of the third transmission coil 144*a* progresses into the other end of the third transmission coil 144*a* may be the first direction.

The wireless power transfer device according to the above embodiments of the present invention includes three transmission substrates. Unlike this, a wireless power transfer device according to other embodiments of the present invention may include two or more than 4 transmission substrates.

Additionally, the base and transmission coils according to the first and second embodiments of the present invention have a rectangular shape. Unlike this, the base and transmission coils may have a circular spiral shape. This will be described with reference to FIG. 6.

Figure 6:
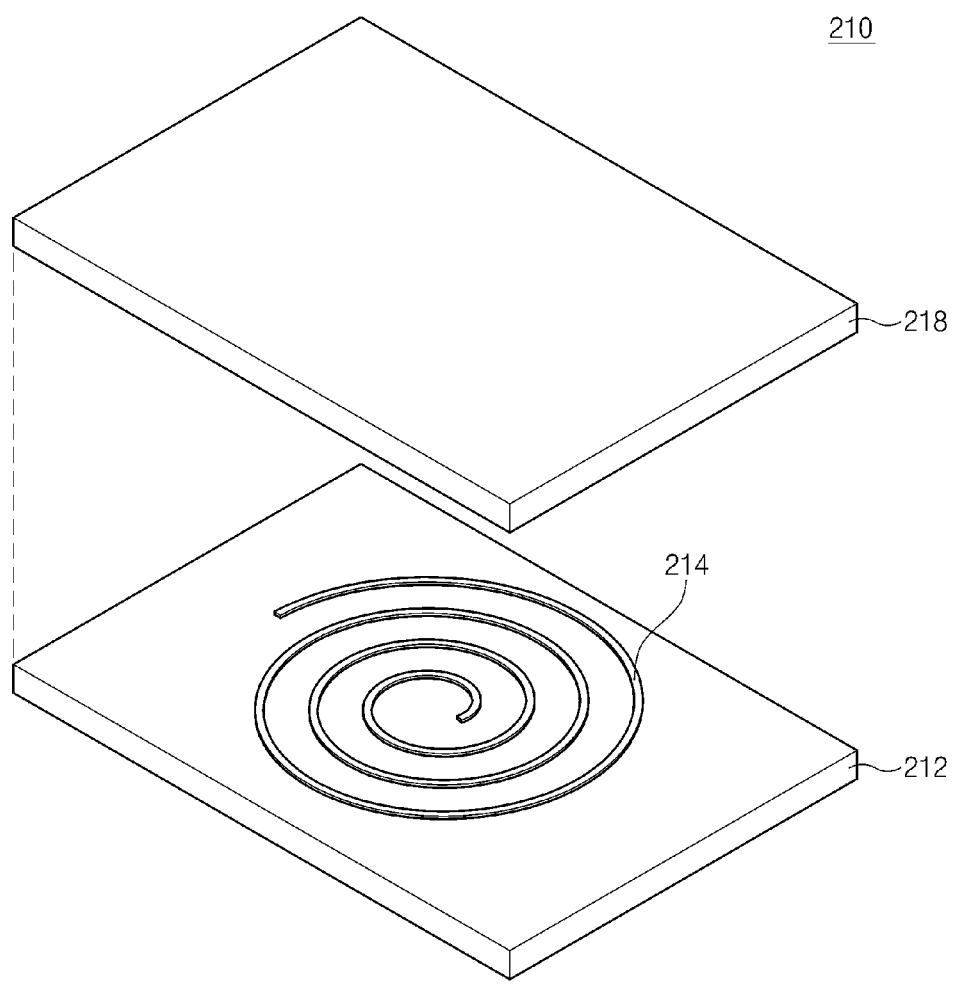
FIG. 6 is a view illustrating a modification according to embodiments of the present invention.

FIG. 6 is a view illustrating a modification according to embodiments of the present invention.

Referring to FIG. 6, a base/transmission substrate 210 may include a lower substrate 212, a base/transmission coil 214 on the lower substrate 212, and an insulation layer 218 covering the lower substrate 212. The lower substrate 212 may be a PCB substrate. The base/transmission coil 214 may be formed with a spiral shape in one dimensional perspective.

Figure 7:
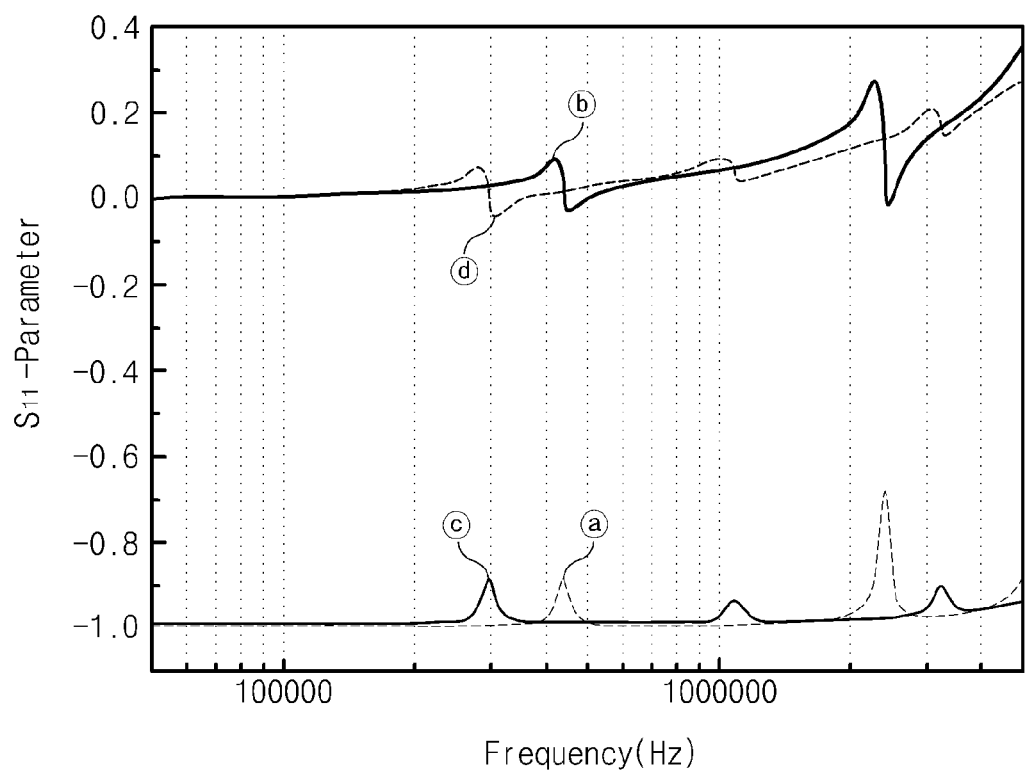
FIGS. 7 and 8 are graphs evaluating characteristics of a wireless power transfer device according to embodiments of the present invention.

FIG. 7 is a graph evaluating characteristics of a wireless power transfer device according to embodiments of the present invention.

Referring to FIG. 7, an x-axis represents a frequency and a y-axis represents a $S_{11}$ parameter. ⓐ and ⓑ of FIG. 7 represent a real part and an imaginary part of the $S_{11}$ parameter when the wireless power transfer device according to the wireless power transfer device according to embodiments of the present invention includes stacked two transmission substrates. ⓒ and ⓓ of FIG. 7 represent a real part and an imaginary part of the $S_{11}$ parameter when the wireless power transfer device according to the wireless power transfer device according to embodiments of the present invention includes stacked three transmission substrates. According to embodiments of the present invention, if a wireless power transfer device includes stacked two transmission substrates, a resonant frequency is about 437.9 KHz. Additionally, if a wireless power transfer device includes stacked three transmission substrates, a capacitance between transmission coils is increased so that a resonance frequency is reduced to about 295.8 KHz.

Figure 8:
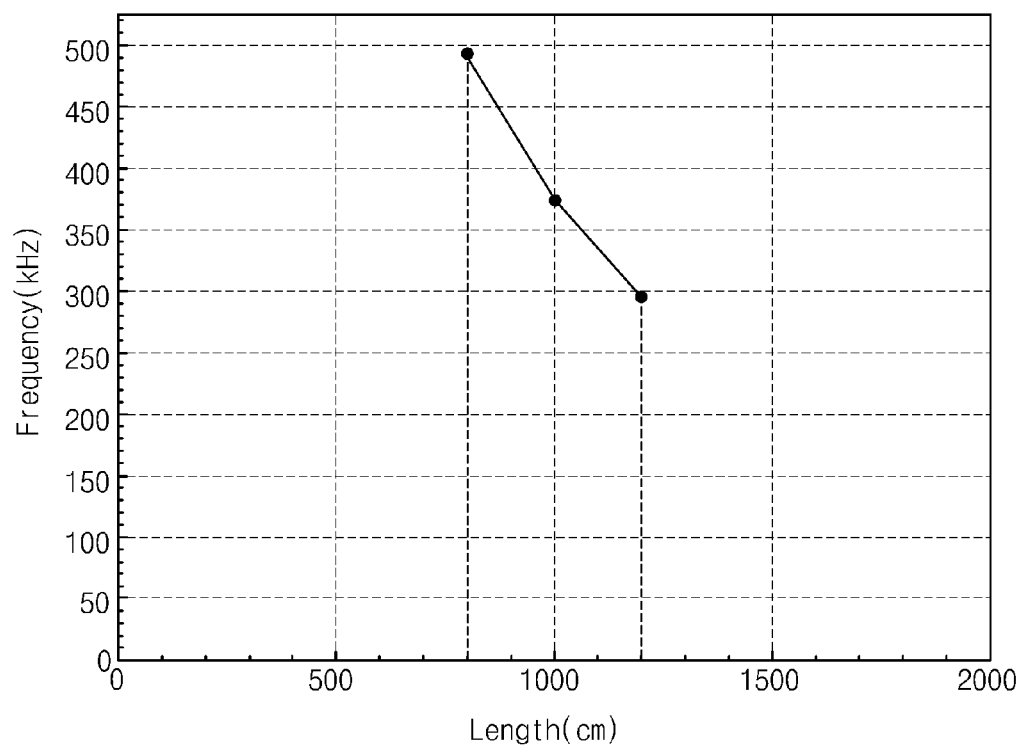

FIG. 8 is a graph illustrating characteristics of a wireless power transfer device according to embodiments of the present invention.

Referring to FIG. 8, an x-axis represents the sum of lengths of transmission coils in embodiments of the present invention and a y-axis represents a resonant frequency. As shown in FIG. 8, when the sum of the lengths of the transmission coils in embodiments of the present invention is about 800 cm, about 1000 cm, or about 1200 cm, a resonant frequency is measured. When the sum of the lengths of the transmission coils is about 800 cm, a resonant frequency is about 500 KHz. When the sum of the lengths of the transmission coils is about 1000 cm, a resonant frequency is about 375 KHz. When the sum of the lengths of the transmission coils is about 1200 cm, a resonant frequency is about 295 KHz. As the length of the transmission coils is increased, the length of the resonant frequency is reduced.

According to embodiments of the present invention, a wireless power transfer device includes a base substrate including a base coil, transmission substrates spaced apart from the base substrate and including transmission coils, and a contact plug penetrating the base substrate and the transmission substrates to connect one ends of the transmission coils. Thus, a capacitance between the stacked transmission coils is increased to reduce resonant frequency and the base coil and the transmission coils are integrated to provide a highly reliable small-sized wireless power transfer device.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A wireless power transfer device comprising:
a base substrate including a base coil;
transmission substrates spaced from the base substrate and including transmission coils; and
a contact plug penetrating the base substrate and the transmission substrates to connect one ends of the transmission coils,
wherein:
the transmission coils have the greater turn number than the base coil and transmitting/receiving a power signal through a magnetic resonance method;
the contact plug comprises first and second contact plugs;
the transmission substrates comprise first to third transmission substrates including first to third transmission coils, respectively, the second transmission substrate being disposed between the first and third transmission substrates;
the first contact plug connects one ends of the respectively adjacent first and second transmission coils and the second contact plug connects the other ends of the respectively adjacent second and third transmission coils; and
the first contact plug is insulated from the third transmission coil and the second contact plug is insulated from the first transmission coil.

2. A wireless power transfer device comprising:
a base substrate including a base coil;
transmission substrates spaced from the base substrate and including transmission coils; and
a contact plug penetrating the base substrate and the transmission substrates to connect one ends of the transmission coils,
wherein the transmission coils have the greater turn number than the base coil and transmitting/receiving a power signal through a magnetic resonance method,
further comprising:
first and second conductive plugs penetrating the base substrate and the transmission substrates;
a connector connected to one end of the base coil; and
a first connection wiring connecting the first conductive plug with the connector;
wherein the second conductive plug is connected to the other end of the base coil.

3. The wireless power transfer device of claim 2, wherein the first and second conductive plugs are insulated from the transmission coils.

4. The wireless power transfer device of claim 2, wherein at least one of the transmission substrates comprises a second connection wiring connecting the first and second conductive plugs.

5. The wireless power transfer device of claim 2, wherein the conductive plugs comprises the same material as the contact plug.

* * * * *